(12) United States Patent
Inoue et al.

(10) Patent No.: US 11,217,430 B2
(45) Date of Patent: Jan. 4, 2022

(54) PLASMA PROCESSING APPARATUS AND PLASMA PROCESSING METHOD

(71) Applicant: TOKYO ELECTRON LIMITED, Tokyo (JP)

(72) Inventors: Masaki Inoue, Miyagi (JP); Koji Koyama, Miyagi (JP); Yasutaka Sakai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 137 days.

(21) Appl. No.: 16/563,528

(22) Filed: Sep. 6, 2019

(65) Prior Publication Data

US 2020/0135430 A1 Apr. 30, 2020

(30) Foreign Application Priority Data

Oct. 29, 2018 (JP) .............................. JP2018-202761

(51) Int. Cl.
*H01J 37/32* (2006.01)
*H05H 1/46* (2006.01)

(52) U.S. Cl.
CPC .... *H01J 37/32266* (2013.01); *H01J 37/3244* (2013.01); *H05H 1/46* (2013.01); *H01J 2237/334* (2013.01)

(58) Field of Classification Search
CPC ............. H01J 37/32266; H01J 37/3244; H01J 223/334; H05H 1/36
See application file for complete search history.

(56) References Cited

U.S. PATENT DOCUMENTS

| | | | | |
|---|---|---|---|---|
| 6,184,623 | B1 * | 2/2001 | Sugai | H01J 37/32082 118/723 AN |
| 7,015,414 | B2 * | 3/2006 | Mitrovic | H01J 37/32082 118/723 I |
| 10,796,884 | B2 * | 10/2020 | Tetsuka | C23C 16/52 |
| 2014/0367043 | A1 * | 12/2014 | Bishara | H01J 37/32082 156/345.28 |

FOREIGN PATENT DOCUMENTS

JP 3122618 B2 10/2000

* cited by examiner

*Primary Examiner* — Dinh T Le
(74) *Attorney, Agent, or Firm* — Weihrouch IP (57) ABSTRACT

A plasma processing apparatus comprises a processing chamber, a gas supply unit, a power supply unit and a frequency control unit. The processing chamber accommodates a target object. The gas supply unit supplies a processing gas into the processing chamber. The power supply unit supplies a power of a predetermined frequency band into the processing chamber to generate plasma of the processing gas in the processing chamber. The frequency control unit sweeps a frequency of the power supplied into the processing chamber by the power supply unit from a first frequency to a second frequency at the time of generating the plasma of the processing gas in the processing chamber.

13 Claims, 6 Drawing Sheets

PLASMA PROCESSING APPARATUS AND PLASMA PROCESSING METHOD

CROSS-REFERENCE TO RELATED APPLICATIONS

This application claims priority to Japanese Patent Application No. 2018-202761, filed on Oct. 29, 2018, the entire contents of which are incorporated herein by reference.

TECHNICAL FIELD

The present disclosure relates to a plasma processing apparatus and a plasma processing method.

BACKGROUND

A device manufacturing process includes a process using plasma. In the process using plasma, a power of a predetermined frequency is supplied into a processing chamber to form plasma from a processing gas supplied into the processing chamber, and the plasma processing such as etching or the like is performed on a target object.

A resonance condition in the processing chamber where plasma exists is different from that in the processing chamber where no plasma exists. Therefore, when the frequency of the power to be supplied into the processing chamber is selected in response to the resonance condition in a steady state in which plasma exists in the processing chamber, plasma may not be generated in the processing chamber.

Therefore, there is known a technique for shifting the frequency of the power supplied into the processing chamber during ignition of plasma to a frequency relatively higher than that in the steady state in which plasma is excited (see, e.g., Japanese Patent No. 3122618).

SUMMARY

The present disclosure provides a plasma processing apparatus and a plasma processing method capable of reliably igniting plasma.

In accordance with an aspect of the present disclosure, there is provided a plasma processing apparatus comprising: a processing chamber that accommodates a target object; a gas supply unit configured to supply a processing gas into the processing chamber; a power supply unit configured to supply a power of a predetermined frequency band into the processing chamber to generate plasma of the processing gas in the processing chamber; and a frequency control unit configured to sweep a frequency of the power supplied into the processing chamber by the power supply unit from a first frequency to a second frequency at the time of generating the plasma of the processing gas in the processing chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a plasma processing apparatus and a plasma processing method of the present disclosure will be described in detail with reference to the accompanying drawings. The following embodiments are not intended to limit the plasma processing apparatus and the plasma processing method of the present disclosure.

A resonance condition in a processing chamber is affected by various factors such as shapes, sizes and positions of components in the processing chamber, types of processing gases, a pressure in the processing chamber, and the like. The shapes and the positions of the components in the processing chamber has dimensional errors, assembly errors or the like. When plasma processing is performed multiple times in the processing chamber, the amount of deposits adhered to the components in the processing chamber, the amount of consumption of the components, and the like are changed. Therefore, the resonance condition in the processing chamber is changed depending on the environment in the processing chamber.

Accordingly, even if a frequency of a power corresponding to the resonance condition in a state where no plasma exists in the processing chamber is determined based on design values, plasma may not be generated in the processing chamber by the power of the determined frequency in the actual processing.

Therefore, the present disclosure provides a technique capable of more reliably igniting plasma.

<Overall Configuration of Plasma Processing Apparatus 1>

Figure 1:
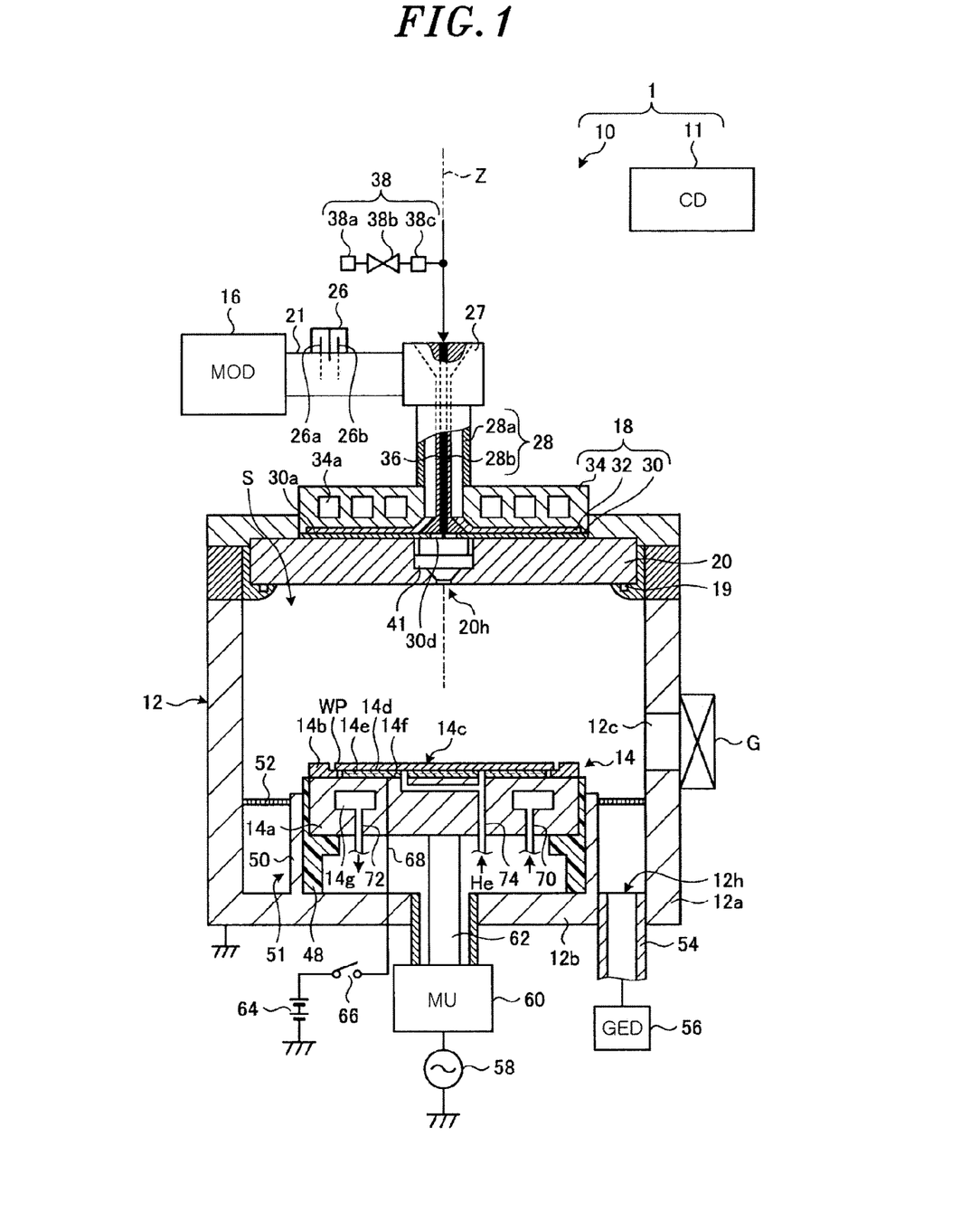
FIG. 1 is a schematic cross-sectional view showing an example of a plasma processing apparatus according to an embodiment.

FIG. 1 is a schematic cross-sectional view showing an example of a plasma processing apparatus 1 according to an embodiment of the present disclosure. The plasma processing apparatus 1 includes an apparatus main body 10 and a control device (CD) 11. The apparatus main body 10 includes a processing chamber 12 and a microwave output device (MOD) 16.

The processing chamber 12 is formed in a substantially cylindrical shape and made of, e.g., aluminum having an anodically oxidized surface or the like. Further, the processing chamber 12 has a substantially cylindrical processing space S therein. The processing chamber 12 is frame-grounded. The processing chamber 12 has a sidewall 12a and a bottom portion 12b. A central axis of the sidewall 12a is defined as an axis Z. The bottom portion 12b is disposed at a lower end side of the sidewall 12a. A gas exhaust port 12h is formed at the bottom portion 12b. An upper end portion of the sidewall 12a is opened.

An opening 12c through which a target object WP is loaded and unloaded is formed at the sidewall 12a. The opening 12c is opened and closed by a gate valve G.

A dielectric window 20 is disposed at the upper end portion of the sidewall 12a, and blocks the opening formed at the upper end portion of the sidewall 12a from above. A bottom surface of the dielectric window 20 faces the processing space S. An O-ring 19 is disposed between the dielectric window 20 and the upper end portion of the sidewall 12a.

A stage 14 is disposed in the processing chamber 12. The stage 14 is disposed to face the dielectric window 20 along the axis Z. A processing space S is formed between the stage 14 and the dielectric window 20. The target object WP is mounted on the stage 14.

The stage 14 has a base 14a and an electrostatic chuck 14c. The base 14a is formed in a substantially disc shape and is made of a conductive material such as aluminum or the like. The base 14a is disposed in the processing chamber 12 such that the central axis of the base 14a substantially coincides with the axis Z.

The base 14a is made of an insulating material and is supported by a cylindrical support 48 extending along the axis Z. A conductive cylindrical support 50 is disposed to surround an outer periphery of the cylindrical support 48. The cylindrical support 50 extends from the bottom portion 12b of the processing chamber 12 toward the dielectric window 20 along the outer periphery of the cylindrical support 48. An annular gas exhaust passage 51 is formed between the cylindrical support 50 and the sidewall 12a.

An annular baffle plate 52 having a plurality of through-holes formed in a thickness direction thereof is disposed at an upper portion of the gas exhaust passage 51. The gas exhaust port 12h is disposed below the baffle plate 52. A gas exhaust device (GED) 56 having a vacuum pump such as a turbo molecular pump or the like, and an automatic pressure control valve is connected to the gas exhaust port 12h through a gas exhaust line 54. A pressure in the processing space S can be depressurized to a desired vacuum level by the gas exhaust device 56.

The base 14a serves as a high frequency electrode. An RF bias high frequency power supply 58 is electrically connected to the base 14a via a power feed rod 62 and a matching unit (MU) 60. The high frequency power supply 58 supplies a bias power of a predetermined frequency (e.g., 13.56 MHz) suitable for controlling the energy of ions attracted to the target object WP to the base 14a via the matching unit 60 and the power feed rod 62.

The matching unit 60 includes a matcher for matching an impedance of the high frequency power supply 58 side and an impedance of a load side such as the electrode, the plasma, and the processing chamber 12. The matcher has therein a blocking capacitor for self-bias generation.

An electrostatic chuck 14c is disposed on an upper surface of the base 14a. The target object WP is attracted and held on the electrostatic chuck 14c by an electrostatic force. The electrostatic chuck 14c has a substantially disc-shape, and has an electrode 14d and insulating films 14e and 14f. The electrostatic chuck 14c is disposed on the upper surface of the base 14a such that the central axis of the electrostatic chuck 14c substantially coincides with the axis Z. The electrode 14d of the electrostatic chuck 14c is made of a conductive film and is disposed between the insulating film 14e and the insulating film 14f. A DC power supply 64 is electrically connected to the electrode 14d via a coated wire 68 and a switch 66. The target object WP can be attracted and held on the upper surface of the electrostatic chuck 14c by the electrostatic force generated by the DC voltage applied from the DC power supply 64. In addition, an edge ring 14b is disposed on the base 14a. The edge ring 14b is disposed to surround the target object WP and the electrostatic chuck 14c. The edge ring 14b may be referred to as "focus ring".

A flow path 14g is formed in the base 14a. A coolant is supplied to the flow path 14g from a chiller unit (not shown) through a line 70. The coolant supplied to the flow path 14g is returned to the chiller unit through a line 72. A temperature of the base 14a is controlled by circulating the coolant having a temperature controlled by the chiller unit in the flow path 14g of the base 14a. By controlling the temperature of the base 14a, the temperature of the target object WP on the electrostatic chuck 14c is controlled via the electrostatic chuck 14c on the base 14a.

A line 74 is formed at the stage 14 to supply a heat transfer gas such as He gas or the like to a gap between the upper surface of the electrostatic chuck 14c and the backside of the target object WP.

The microwave output device 16 outputs a microwave for exciting the processing gas supplied into the processing chamber 12. The microwave output device 16 can adjust a frequency and a power of the microwave. The microwave output device 16 can generate a microwave having a set power while performing frequency modulation within a set frequency range. In the present embodiment, the frequency modulation indicates changing the frequency temporally. The frequency-modulated microwave will be described later. The microwave output device 16 can adjust the frequency of the microwave within a range of, e.g., 2.4 GHz to 2.5 GHz. The microwave output device 16 is an example of a frequency control unit.

The apparatus main body 10 further includes a waveguide 21, a tuner 26, a mode transducer 27, and a coaxial waveguide 28. An output unit of the microwave output device 16 is connected to one end of the waveguide 21. The other end of the waveguide 21 is connected to the mode transducer 27. The waveguide 21 is, e.g., a rectangular waveguide. A tuner 26 is disposed in the waveguide 21. The tuner 26 has movable plates 26a and 26b. By adjusting the amount of projection of the movable plates 26a and 26b into the inner space of the waveguide 21, an impedance of the microwave output device 16 can be matched with the impedance of the load.

The mode transducer 27 converts a mode of the microwave outputted from the waveguide 21 and supplies the microwave after the mode conversion to the coaxial waveguide 28. The coaxial waveguide 28 includes an outer conductor 28a and an inner conductor 28b. The outer conductor 28a and the inner conductor 28b have a substantially cylindrical shape. The outer conductor 28a and the inner conductor 28b are disposed above an antenna 18 such that the central axes of the outer conductor 28a and the inner conductor 28b substantially coincide with the axis Z. The coaxial waveguide 28 transmits the microwave of which mode has been converted by the mode transducer 27 to the antenna 18.

The antenna 18 supplies the microwave into the processing chamber 12. The antenna 18 is an example of a power supply unit. The antenna 18 is disposed on the upper surface of the dielectric window 20. The antenna 18 includes a slot plate 30, a dielectric plate 32 and a cooling jacket 34. The slot plate 30 is formed in a substantially disc shape and is made of a conductive metal. The slot plate 30 is disposed on the upper surface of the dielectric window 20 such that the central axis of the slot plate 30 coincides with the axis Z. The slot plate 30 is provided with a plurality of slot holes 30a. The slot holes 30a form, e.g., multiple slot pairs. Each of the slot pairs includes two elongated slot holes 30a extending in a direction intersecting each other. The slot pairs are arranged along one or more concentric circles around the central axis of the slot plate 30. A through-hole 30d through which a conduit 36 to be described later can penetrate is formed at the central portion of the slot plate 30.

The dielectric plate 32 is formed in a substantially disc shape and is made of a dielectric material such as quartz or the like. The dielectric plate 32 is disposed on the slot plate 30 such that the central axis of the dielectric plate 32 substantially coincides with the axis Z. The cooling jacket 34 is disposed on the dielectric plate 32. The dielectric plate 32 is disposed between the cooling jacket 34 and the slot plate 30.

The cooling jacket 34 has a conductive surface. A flow path 34a is formed in the cooling jacket 34. A coolant is supplied to the flow path 34a from a chiller unit (not shown). The lower end of the outer conductor 28a is electrically connected to the upper surface of the cooling jacket 34. The lower end of the inner conductor 28b is electrically connected to the slot plate 30 through an opening formed at central portions of the cooling jacket 34 and the dielectric plate 32.

The microwave from the coaxial waveguide 28 propagates through the dielectric plate 32 and then is supplied to the dielectric window 20 through the slot holes 30a of the slot plate 30. The microwave supplied to the dielectric window 20 is radiated from the bottom surface of the dielectric window 20 into the processing space S.

The conduit 36 is disposed in the inner conductor 28b of the coaxial waveguide 28. A through-hole 30d through which the conduit 36 can pass is formed at the central portion of the slot plate 30. The conduit 36 extends through the inner conductor 28b and is connected to the gas supply unit 38.

The gas supply unit 38 supplies a processing gas for processing the target object WP to the conduit 36. The gas supply unit 38 includes a gas supply source 38a, a valve 38b, and a flow rate controller 38c. The gas supply source 38a is a supply source of a processing gas. The valve 38b controls start and stop of the supply of the processing gas from the gas supply source 38a. The flow rate controller 38c is, e.g., a mass flow controller, and controls a flow rate of the processing gas from the gas supply source 38a.

The apparatus main body 10 includes an injector 41. The injector 41 supplies the gas from the conduit 36 to a through-hole 20h formed in the dielectric window 20. The gas supplied to the through-holes 20h of the dielectric window 20 is injected to the processing space S and excited by the microwave introduced from the dielectric window 20 into the processing space S. Accordingly, plasma of the processing gas is generated in the processing space S, and the target object WP is processed by ions, radicals and the like contained in the plasma.

The control device 11 includes a processor, a memory, and an input/output interface. A program and a process recipe are stored in the memory. The processor reads out the program from the memory and executes the program to control the respective components of the control device 11 through the input/output interface based on the process recipe stored in the memory.

The microwave output device 16 has, e.g., a voltage controlled oscillator (VCO) and generates a microwave of a frequency corresponding to a voltage set by the control device 11. In the present embodiment, as shown in FIG. 2, for example, the microwave output device 16 generates a microwave whose frequency is swept in a sawtooth pattern at a predetermined cycle T within a range from a frequency fL to a frequency fH.

Figure 2:
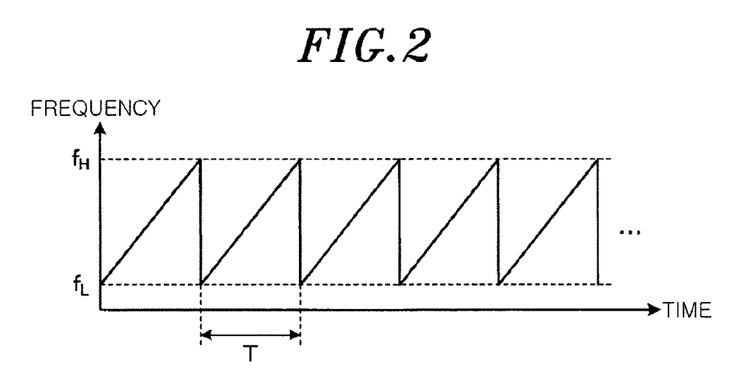
FIG. 2 shows an example of temporal changes of a frequency of a microwave.

FIG. 2 shows an example of temporal changes of the frequency of the microwave. In the microwave of the present embodiment, as shown in FIG. 2, for example, after the frequency changes from the frequency fL to the frequency fH, the frequency changes from the frequency fL to the frequency fH. In the present embodiment, the frequency fL is, e.g., 2.4 GHz, and the frequency fH is, e.g., 2.5 GHz. Therefore, the microwave output device 16 generates a microwave of a frequency that is swept at a predetermined cycle T within a range of 100 MHz. The frequency fL is an example of a first frequency, and the frequency fH is an example of a second frequency.

Figure 3:
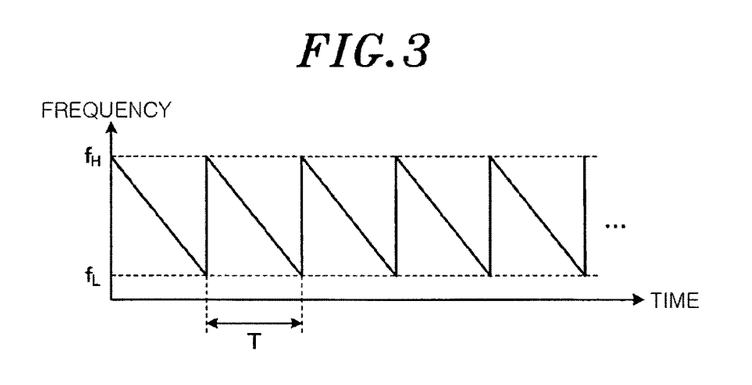
FIG. 3 shows another example of the temporal changes of the frequency of the microwave.
Figure 4:
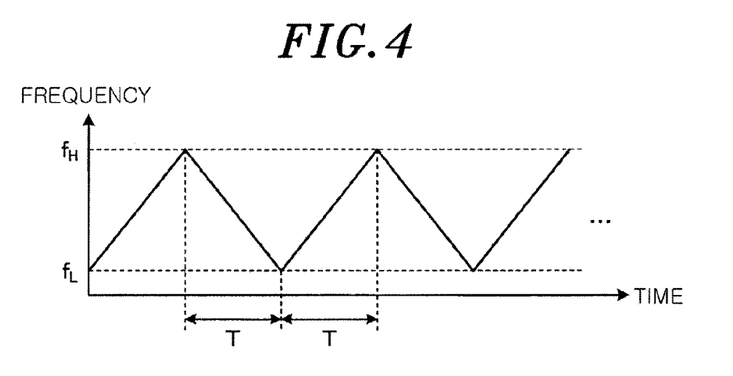
FIG. 4 shows still another example of the temporal change of the frequency of the microwave.

As shown in FIG. 3 or 4, for example, the microwave output device 16 may generate a microwave whose frequency is swept at a predetermined cycle T within a range from the frequency fL to the frequency fH. FIGS. 3 and 4 show other examples of the temporal changes of the frequency of the microwave. In FIG. 3, the frequency changes from the frequency fH to the frequency fL, and then changes from the frequency fH to the frequency fL. In FIG. 4, the frequency changes from the frequency fL to the frequency fH, and changes from the frequency fH to the frequency fL, and then changes from the frequency fL to the frequency fH.

The tuner 26 is disposed in the waveguide 21. The tuner 26 operates the movable plates 26a and 26b using a driver circuit and an actuator (both not shown) based on a control signal from the control device 11. Accordingly, the tuner 26 adjusts projecting positions of the movable plates 26a and 26b to match an impedance of the microwave output device 16 side with an impedance of the antenna 18 side. The projecting positions of the movable plates 26a and 26b may be adjusted by a stub structure.

<Ignition of Plasma>

In order to generate plasma in the processing space S of the processing chamber 12, a processing gas is supplied into the processing space S, and a pressure in the processing space S is controlled to a predetermined pressure. Then, a microwave of a predetermined frequency is radiated into the processing space S through the antenna 18 and the dielectric window 20, thereby generating the plasma of the processing gas in the processing space S.

However, the resonance frequency in the processing space S is affected by the states of the components in the processing chamber 12, the types of the processing gases, the pressure in the processing chamber 12, the temperatures of the components in the processing chamber 12, and the like. The states of the components in the processing chamber 12 include, e.g., dimensional errors of the components, assembly errors of the components, the consumption of the components, the amount of reaction by-products (so-called deposits) adhered to the components, and the like. Therefore, the resonant frequency may be different from the design value depending on the state in the processing chamber 12.

Figure 5:
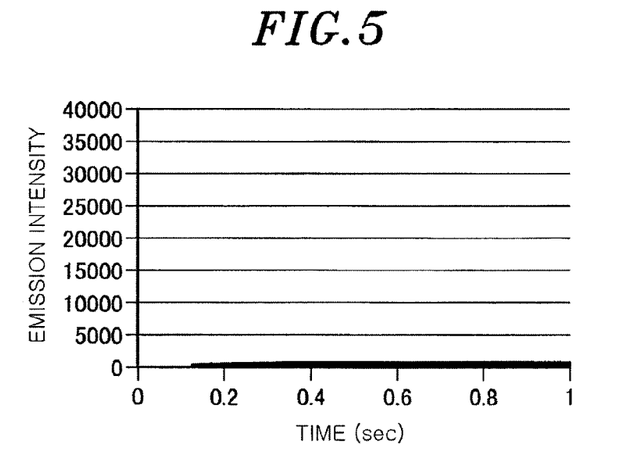
FIG. 5 shows a test result showing an example of plasma emission intensity in the case of using a microwave having a single fixed frequency.

Therefore, even if a microwave of a predetermined frequency (e.g., 2.46 GHz) is supplied, plasma may not be generated as shown in FIG. 5, for example. FIG. 5 shows a test result showing an example of a plasma emission intensity in the case of using a microwave having a single fixed frequency. In the example of FIG. 5, an O atom emission intensity (wavelength=777 nm) is illustrated. When the plasma is successfully generated, light of the wavelength corresponding to the O atom is observed. However, in the example of FIG. 5, light of the wavelength corresponding to the O atom is not observed.

In the example of FIG. 5, plasma ignition was attempted ten times mainly under the following conditions:

Pressure in the processing chamber 12: 150 mTorr
Microwave power: 2400 W
Processing gas: $SF_6/O_2$=10/290 sccm.

Figure 6:
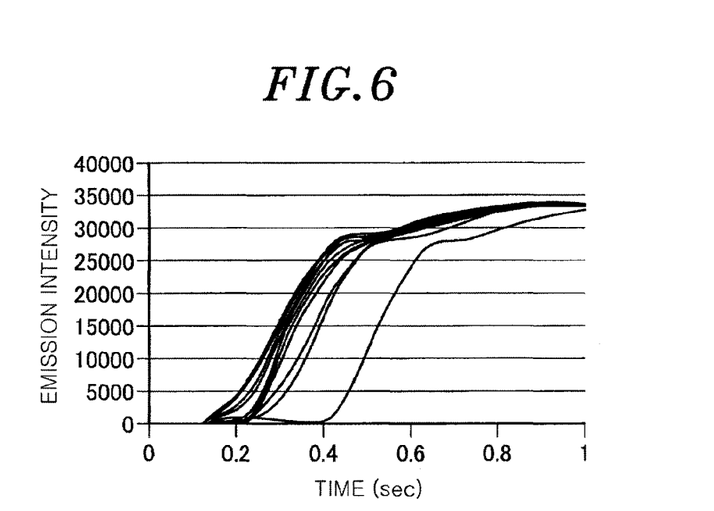
FIG. 6 shows a test result showing an example of plasma emission intensity in the case of using a broadband microwave.

Next, plasma was generated using a microwave including a plurality of microwaves of different frequencies (hereinafter, referred to as "broadband microwave") within a predetermined frequency bandwidth (e.g., ±5 MHz) centered at a predetermined frequency (e.g., 2.46 GHz). FIG. 6 shows a test result showing an example of a plasma emission intensity in the case of using a broadband microwave. The conditions used in the test of FIG. 6 are the same as those used in the test of FIG. 5 except the microwave condition. In the test of FIG. 6 as well, plasma was ignited ten times.

In the case of using the broadband microwave, although the plasma is ignited, the ignition timing of the plasma varies within a range of 0.1 seconds to 0.4 seconds as shown in FIG. 6, for example. When the ignition timing of the plasma varies, the period of time in which the target object WP is exposed to the plasma varies. Accordingly, the reproducibility of the plasma processing for multiple target objects WP decreases.

Figure 7:
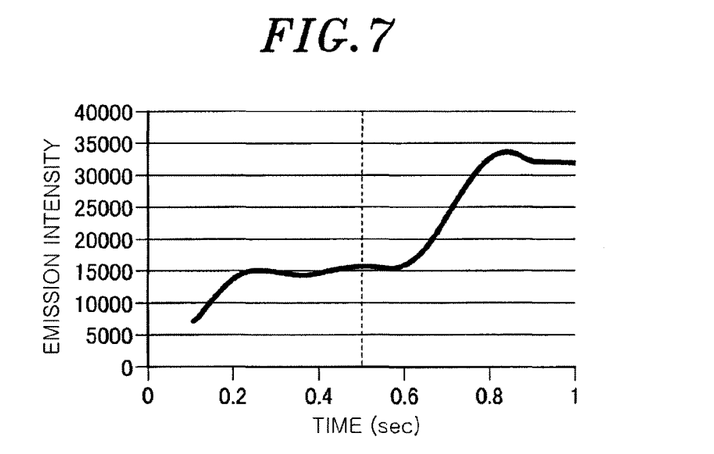
FIG. 7 shows a test result showing an example of plasma emission intensity in the case of using a microwave whose frequency is swept.

Next, as shown in FIG. 2, plasma was generated using a microwave whose frequency was swept in a sawtooth pattern at a predetermined cycle T within a range from frequency fL to frequency fH. FIG. 7 shows a test result showing an example of the plasma emission intensity in the case of using a microwave whose frequency was swept.

The conditions used in the test of FIG. 7 are the same as those used in the test of FIG. 5 except the microwave condition. In the case of the microwave whose frequency was swept which was used in the test of FIG. 7, the frequency sweep cycle T is 5 microseconds. In the test of FIG. 7 as well, the plasma ignition was attempted ten times.

In the case of using the microwave whose frequency was swept, the plasma was ignited when 0.1 seconds has elapsed from the start of the microwave supply in all ten attempts. Therefore, the plasma can be reliably ignited by using the microwave whose frequency was swept.

Further, the variation in the ignition timing of the plasma was hardly observed as shown in FIG. 7. Therefore, by using the microwave whose frequency was swept, the exposure time of the target objects WP to the plasma can become substantially the same, and the reproducibility of the plasma processing for multiple target objects WP can be improved.

In the test of FIG. 7, the broadband microwave was supplied into the processing chamber 12, instead of the microwave whose frequency was swept, when 0.5 seconds has elapsed from the start of the microwave supply. Accordingly, after the plasma is ignited, the projecting positions of the movable plates can be adjusted to match the impedance of the microwave output device 16 side with the impedance of the antenna 18 side. When the impedance is adjusted by the tuner 26, the energy of the microwave is sufficiently supplied to the plasma, and the plasma emission intensity (O atom emission intensity in the example of FIG. 7) increases.

<Frequency Sweep Cycle>

Figure 8:
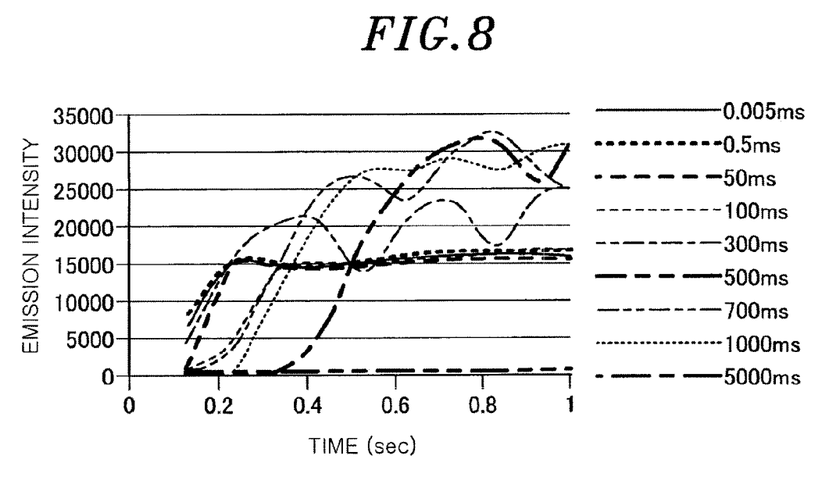
FIG. 8 shows a test result showing an example of a relationship between a frequency sweep cycle and a plasma emission intensity.

Next, in the microwave whose frequency was swept, the state of the plasma was observed while changing the frequency sweep cycle T. FIG. 8 shows a test result showing an example of a relationship between the frequency sweep cycle T and the plasma emission intensity.

Referring to FIG. 8, in the case of the microwaves having frequency sweep cycles T of 5 microseconds, 0.5 milliseconds, 50 milliseconds, and 300 milliseconds, the plasma was ignited when 0.1 seconds has elapsed from the start of the microwave supply. In the case of the microwaves having the frequency sweep cycles T longer than 50 milliseconds except the frequency sweep cycle T of 300 milliseconds, the plasma was not ignited when 0.1 seconds has elapsed from the start of the microwave supply.

On the other hand, in the case of the microwaves having the frequency sweep cycles T of 50 milliseconds or less, the plasma was ignited when 0.1 second has elapsed from the start of the microwave supply. This is considered to be because when the frequency sweep cycle T is short, the frequency of the microwave often coincides with the resonant frequency of the processing space S during the sweep of the frequency. Therefore, the frequency of the microwave coincides with the resonance frequency of the processing space S before the plasma that was ignited when the frequency of the microwave coincides with the resonance frequency of the processing space S extinguishes, thereby supplying the energy to the plasma and maintaining the plasma. Accordingly, the frequency sweep cycle T is preferably 50 milliseconds or less. In other words, it is preferable that the microwave output device 16 sweeps the frequency of the microwave supplied into the processing chamber 12 at a speed of 50 milliseconds or less per 100 MHz.

<Plasma Processing>

Figure 9:
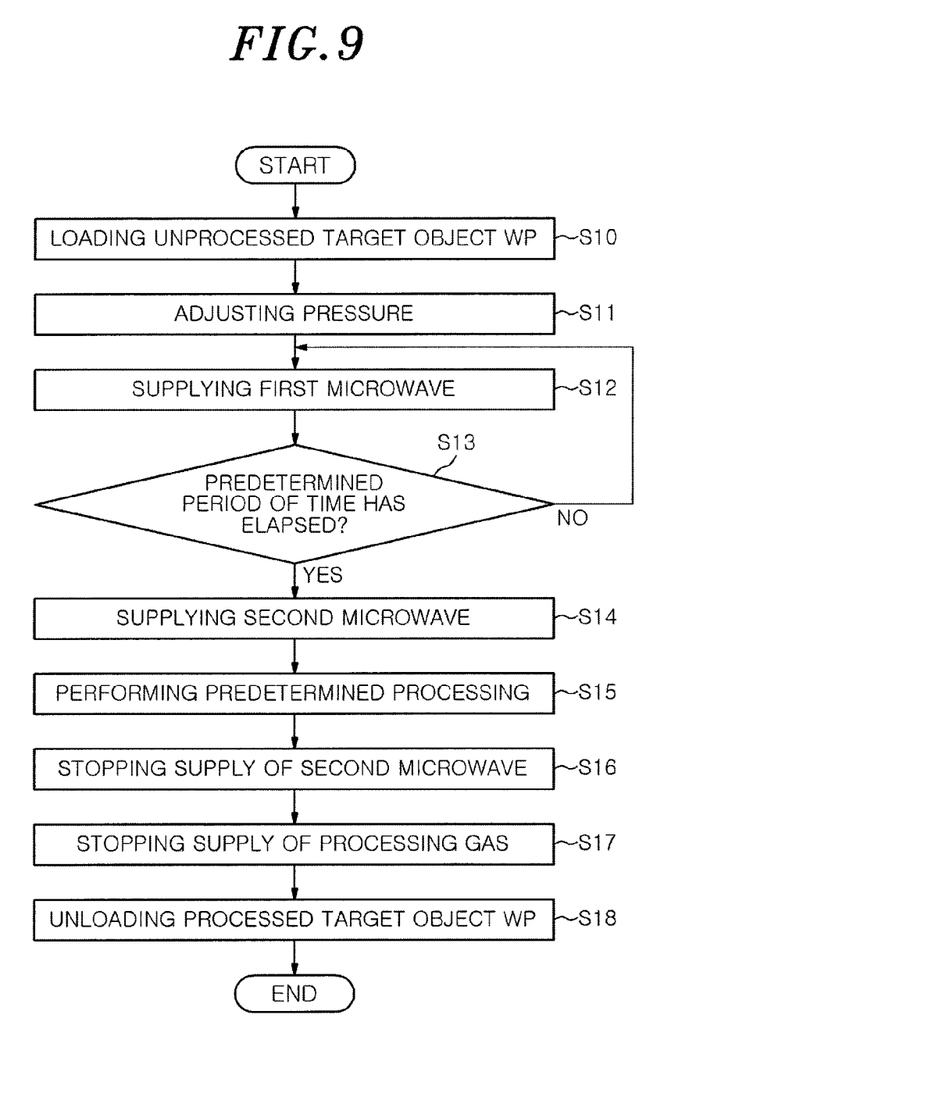
FIG. 9 is a flowchart showing an example of plasma processing according to one embodiment.

FIG. 9 is a flowchart of an example of plasma processing according to an embodiment of the present disclosure. The plasma processing illustrated in FIG. 9 is realized by the control device 11 for controlling the respective components of the apparatus main body 10.

First, the gate valve G is opened, and an unprocessed target object WP is loaded into the processing chamber 12 through the opening 12c and mounted on the electrostatic chuck 14c by a robot arm (not shown) (step S10). Step S10 is an example of a loading process. Then, the gate valve G is closed. Then, the control device 11 opens the valve 38b and controls the flow controller 38c to supply the processing gas at a predetermined flow rate into the processing chamber 12. Then, the control device 11 controls the gas exhaust device 56 to adjust the pressure in the processing chamber 12 (step S11). Step S11 is an example of a supply process.

Next, the control device 11 controls the microwave output device 16 to supply a first microwave into the processing chamber 12 via the antenna 18 (step S12). The first microwave has a frequency that is swept within a predetermined frequency range. In the present embodiment, the frequency of the first microwave is swept at a cycle of 50 milliseconds or less within a frequency range of 2.4 GHz to 2.5 GHz. Accordingly, the plasma of the processing gas is generated in the processing chamber 12. Step S12 is an example of a generation process.

Then, the control device 11 determines whether or not a predetermined period of time (e.g., 0.5 seconds) has elapsed from the start of the supply of the first microwave (step S13). If the predetermined period of time has not elapsed (NO in step S13), the process in step S12 is executed again.

On the other hand, when the predetermined period of time has elapsed (YES in step S13), the control device 11 controls the microwave output device 16 to supply a second microwave, instead of the first microwave, into the processing chamber 12 via the antenna 18 (step S14). In the present embodiment, the second microwave is a broadband microwave including a plurality of microwaves of different frequencies within a frequency bandwidth of ±5 MHz centered at 2.46 GHz.

Then, the control device 11 controls the high frequency power supply 58 to supply a bias power to the base 14a via the matching unit 60 and the power feed rod 62. Then, predetermined processing such as etching or the like is performed on the target object WP by the plasma generated in the processing chamber 12 (step S15). The bias power may be supplied from the high frequency power supply 58 to the base 14a prior to step S12.

When the process is completed, the control device 11 controls the microwave output device 16 to stop the supply of the second microwave and the bias power (step S16). Then, the control device 11 closes the valve 38b to stop the supply of the processing gas into the processing chamber 12 (step S17). Then, the gate valve G is opened, and the processed target object WP is unloaded from the processing chamber 12 through the opening 12c by the robot arm (not shown) (step S18). Then, the plasma processing shown in the flowchart is terminated.

In the plasma processing apparatus 1 according to the above-described first embodiment includes the processing chamber 12, the gas supply unit 38, the antenna 18, and the microwave output device 16. The processing chamber 12 accommodates the target object WP. The gas supply unit 38 supplies the processing gas into the processing chamber 12. The antenna 18 supplies a power of a predetermined frequency band into the processing chamber 12 to generate plasma of the processing gas in the processing chamber 12. The microwave output device 16 sweeps the frequency of the power supplied from the antenna 18 into the processing chamber 12 from the first frequency to the second frequency during the generation of the plasma of the processing gas in the processing chamber 12. Accordingly, the plasma can be more reliably ignited.

In the above-described embodiment, the microwave output device 16 sweeps the frequency of the power supplied into the processing chamber 12 from the first frequency to the second frequency multiple times. Accordingly, the plasma can be more reliably ignited.

Further, in the above-described embodiment, the microwave output device 16 sweeps the frequency of the power supplied into the processing chamber 12 at a speed of 50 milliseconds or less per 100 MHz. Accordingly, the plasma can be more reliably ignited.

Moreover, in the above-described embodiment, the frequency band of the power supplied into the processing chamber 12 by the antenna 18 is the microwave band. Accordingly, the plasma can be more reliably ignited in the plasma processing using a microwave.

<Others Applications>

The present disclosure is not limited to the above-described embodiment, and various modifications can be made within the scope of the gist of the present disclosure.

For example, in the above-described embodiment, the microwave output device 16 sweeps the frequency of the power supplied into the processing chamber 12 from the first frequency to the second frequency multiple times. However, the present disclosure is not limited thereto. For example, the microwave output device 16 may sweep the frequency of the power supplied into the processing chamber 12 from the first frequency to the second frequency at least once. Since the frequency of the power supplied into the processing chamber 12 is swept from the first frequency to the second frequency at least once, the frequency of the microwave coincides with the resonant frequency of the processing space S at least once. Accordingly, the plasma can be ignited.

Further, in the above-described embodiment, the single frequency of the microwave is swept at a predetermined cycle T within a predetermined frequency range. However, the present disclosure is not limited thereto. In another example, a center frequency of a broadband microwave including a plurality of microwaves of different frequencies within a predetermined frequency bandwidth (e.g., ±5 MHz) centered at a predetermined frequency may be swept at a predetermined cycle T within a predetermined frequency range.

Moreover, in the above-described embodiment, the plasma etching process has been described as an example of the plasma processing. However, the present disclosure is not limited thereto, and may be applied to another plasma processing, e.g., film formation, modification, cleaning or the like.

Further, in the above-described embodiment, the microwave plasma was used as an example of the plasma source. However, the present disclosure is not limited thereto. The plasma source may be, e.g., capacitively coupled plasma (CCP), inductively coupled plasma (ICP), or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
    a processing chamber having a stage on which a target object is mounted;
    a gas supply unit configured to supply a processing gas into the processing chamber; and
    a frequency control unit configured to supply a power of a predetermined frequency band into the processing chamber to generate plasma of the processing gas in the processing chamber,
    wherein the frequency control unit is configured to sweep a frequency of the supplied power from a first frequency to a second frequency and back to the first frequency multiple times, in generating the plasma of the processing gas in the processing chamber.

2. The plasma processing apparatus of claim 1, wherein the frequency control unit sweeps the frequency of the power at a speed of 50 milliseconds or less per 100 MHz.

3. The plasma processing apparatus of claim 1, wherein the predetermined frequency band is a microwave band between 2.4 GH to 2.5 GHz.

4. The plasma processing apparatus of claim 2, wherein the predetermined frequency band is a microwave band between 2.4 GH to 2.5 GHz.

5. A plasma processing method comprising:
    loading a target object into a stage of a processing chamber;
    supplying a processing gas into the processing chamber; and
    generating plasma of the processing gas in the processing chamber by supplying a power of a predetermined frequency band into the processing chamber, wherein in said generating the plasma of the processing gas in the processing chamber, a frequency of the power supplied into the processing chamber is swept from a first frequency to a second frequency and back to the first frequency multiple times.

6. The plasma processing apparatus of claim 1, wherein the first frequency and the second frequency are respectively a maximum value and a minimum value within a predetermined frequency bandwidth centered at a predetermined frequency, or the first frequency and the second frequency are respectively a minimum value and a maximum value within the predetermined frequency bandwidth centered at the predetermined frequency.

7. The plasma processing apparatus of claim 1, wherein the first frequency is a minimum value within a predetermined frequency bandwidth centered at a predetermined frequency and the second frequency is a maximum value within the predetermined frequency bandwidth centered at the predetermined frequency, and the frequency control unit is configured to sweep the frequency of the power multiple times such that the frequency of the power monotonically increases at a predetermined cycle from the first frequency to the second frequency.

8. The plasma processing apparatus of claim 1, wherein the first frequency is a maximum value within a predetermined frequency bandwidth centered at a predetermined frequency and the second frequency is a minimum value within the predetermined frequency bandwidth centered at the predetermined frequency, and the frequency control unit is configured to sweep the frequency of the power multiple times such that the frequency of the power monotonically decreases at a predetermined cycle from the first frequency to the second frequency.

9. The plasma processing apparatus of claim 1, wherein the first frequency is a minimum value within a predetermined frequency bandwidth centered at a predetermined frequency and the second frequency is a maximum value within the predetermined frequency bandwidth centered at the predetermined frequency, and the frequency control unit is configured to sweep the frequency of the power multiple times such that the frequency of the power monotonically increases at a predetermined cycle from the first frequency to the second frequency and then monotonically decreases at the predetermined cycle from the second frequency to the first frequency.

10. The plasma processing apparatus according to claim 1, wherein the apparatus includes a microwave output device and a tuner which is positioned along a waveguide, and wherein the frequency control unit controls the microwave output device to sweep the frequency of the microwave output device, and wherein the frequency control unit is part of a control device which controls the tuner; and wherein the control device is further configured to control the tuner to match an impedance of the microwave output device, after ignition of the plasma by repeating the sweep from the first frequency to the second frequency and back to the first frequency multiple times, to increase emission intensity of the plasma after the sweep multiple times.

11. The plasma processing apparatus according to claim 10, wherein the frequency control unit is configured to control the sweep from the first frequency to the second frequency and back to the first frequency in a sawtooth pattern.

12. The plasma processing apparatus according to claim 1, wherein the frequency control unit is configured to control the sweep from the first frequency to the second frequency and back to the first frequency in a sawtooth pattern.

13. A plasma processing apparatus comprising:
a processing chamber having a stage on which a target object is mounted;
a gas supply unit configured to supply a processing gas into the processing chamber; and
a frequency control unit configured to supply a power of a predetermined frequency band into the processing chamber to generate plasma of the processing gas in the processing chamber,
wherein the frequency control unit is configured to sweep a frequency of the supplied power monotonically from a first frequency to a second frequency, in generating the plasma of the processing gas in the processing chamber, and
wherein the frequency of the power is swept multiple times from the first frequency to the second frequency.

* * * * *